United States Patent
Natarajan et al.

(10) Patent No.: US 11,588,608 B1
(45) Date of Patent: Feb. 21, 2023

(54) TRANSMITTER-BASED, MULTI-PHASE CLOCK DISTORTION CORRECTION

(71) Applicant: NVIDIA Corporation, Santa Clara, CA (US)

(72) Inventors: Venkatraman Natarajan, Santa Clara, CA (US); Arif Amin, Fremont, CA (US); Dai Dai, Sunnyvale, CA (US); Olakanmi Oluwole, Mountain View, CA (US); Shashank Mahajan, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/394,127

(22) Filed: Aug. 4, 2021

(51) Int. Cl.
*H04L 7/00* (2006.01)
*H03L 7/10* (2006.01)
*H04L 7/033* (2006.01)

(52) U.S. Cl.
CPC ............ *H04L 7/0008* (2013.01); *H03L 7/10* (2013.01); *H04L 7/033* (2013.01)

(58) Field of Classification Search
CPC .......... H04L 7/0008; H04L 7/033; H03L 7/10
See application file for complete search history.

(56) References Cited

U.S. PATENT DOCUMENTS

| | | | |
|---|---|---|---|
| 7,340,021 B1* | 3/2008 | Churchill | H04L 7/0338 375/376 |
| 10,784,847 B1* | 9/2020 | Tandon | H03K 5/1565 |
| 11,228,416 B1* | 1/2022 | Huss | H04L 7/0091 |
| 11,256,286 B1* | 2/2022 | Meikanda Muthu Ayyanar | G06F 1/08 |
| 2020/0293080 A1* | 9/2020 | Poon | H03K 5/1565 |

* cited by examiner

*Primary Examiner* — Dac V Ha
(74) *Attorney, Agent, or Firm* — Lowenstein Sandler LLP

(57) ABSTRACT

A device includes a transmitter to transmit serialized data within a differential direct-current (DC) signal over a differential output line, a multiplexer circuit coupled to the transmitter, and a calibration circuit coupled between the differential output line, a multi-phase clock, and the multiplexer circuit. The multiplexer circuit is to select the serialized data from ones of multiple input lines according to a multi-phase clock and pass the selected serialized data to the transmitter. The serialized data includes a calibration bit pattern. The calibration circuit is to capture and digitize the differential DC signal into a digital stream, measure an error value from the digital stream that is associated with distortion based on the calibration bit pattern, convert the error value into a gradient value, and correct one or more phases of the multi-phase clock to compensate for the distortion based on the gradient value.

20 Claims, 8 Drawing Sheets

US 11,588,608 B1

TRANSMITTER-BASED, MULTI-PHASE CLOCK DISTORTION CORRECTION

TECHNICAL FIELD

At least one embodiment pertains to processing resources used to perform and facilitate network communication. For example, at least one embodiment pertains to technology for transmitter-based, multi-phase clock distortion correction.

BACKGROUND

Network devices including those that employ serializer/deserializer (SerDes) technology have been designed to correct for clock impairments caused by distortions such as pulse width distortion (PWD). Pulse width distortion can occur between clock correction circuitry and multiplexer circuitry used to perform the serialization of incoming data streams. Pulse width distortion also impacts other network devices that employ a multi-phase clock. As communication speeds in such network devices have increased, the need to correct for clock impairment has increased. For example, the Institute of Electrical and Electronics Engineers (IEEE) 802.3 Ethernet standard requires stringent even-odd jitter (EOJ) compliance, e.g., less than 0.019 unit interval (UI) peak-to-peak. This tight specification cannot be met with correcting only for distortion caused between the clock correction circuitry and the multiplexer circuitry or other data processing circuitry that employs a multi-phase clock.

BRIEF DESCRIPTION OF DRAWINGS

Various embodiments in accordance with the present disclosure will be described with reference to the drawings, in which.

DETAILED DESCRIPTION

Figure 1A:
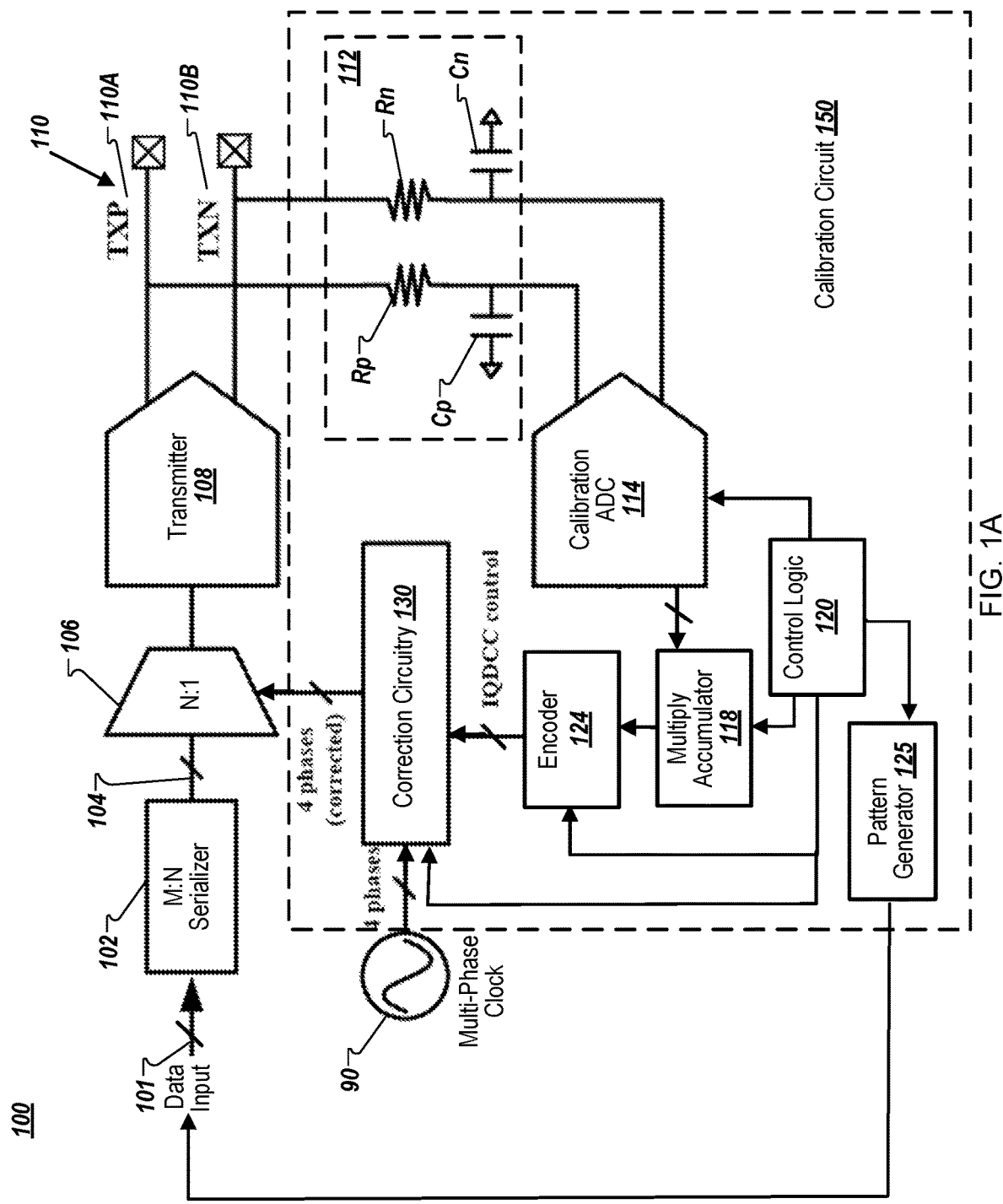
FIG. 1A is a circuit diagram of a data serializer system that employs transmitter-based, multi-phase distortion correction, in accordance with at least some embodiments.

As described above, tight EOJ specification required by the IEEE 802.3 Ethernet standard cannot be met with correcting only for distortion (such as PWD) caused between clock correction circuitry and multiplexer circuitry or other data processing circuitry that relies on a multi-phase clock. This is at least because the transmitter in the network device causes additional distortion due to duty cycle distortion (DCD), e.g., where a width of a pulse is increased or decreased, and delay difference (skew) between the different phases of a multi-phase clock. While the disclosed embodiments refer to a four-phase clock, the present disclosure is applicable to fewer or additional phases of a clock, as would be apparent to those skilled in the art of multi-phase-clocked network devices. The present multi-phase clock, used by way of example, includes in-phase (0-degree), inverted in-phase (180-degree), quadrature (90-degree), and inverted quadrature (270-degree) signals. The term "inverted" here is also sometimes referred to as "complementary."

To resolve these distortions at such tight EOJ specification, the disclosed data serializer system, device, and corresponding methods employ a digitally-assisted transmission data pattern-based approach to sense distortions at the transmitter output that correct for distortions (such as PWD) induced by distortions in the multi-phase clock path. The multi-phase clock path includes at least an optional serializer, a multiplexer circuit that is fed by the optional serializer, and the transmitter that is fed by the multiplexer circuit. In these embodiments, the multiplexer circuit receives the multi-phase clock and performs timing of the selection of data streams at the input to pass to the output of the multiplexer circuit based on the phases of the multi-phase clock. While detailed implementations of this calibration process are illustrated with a quarter-rate clocking scheme, the proposed calibration is applicable to any N-rate transmission clocking system within the multiplexer circuit for N being greater than two, e.g., 2:1, 4:1, 8:1, and so forth.

More specifically, in at least some embodiments, the transmitter transmits serialized data within a differential direct-current (DC) signal over a differential output line, e.g., having positive and negative output terminals. The multiplexer circuit that is coupled to the transmitter can select the serialized data from one of multiple input lines according to a multi-phase clock, where the serialized data includes a calibration bit pattern. The calibration bit pattern can be a first bit pattern to correct for skew, a second bit pattern to correct for in-phase duty cycle distortion (IDCD), a third bit pattern to correct for quadrature duty cycle distortion (QDCD). Each of these three possible calibration bit patterns can be time-multiplexed through the input in order to concurrently calibrate for IDCD, QDCD, and skew within calibration circuitry.

In at least some embodiments, the multiplexer circuit passes the selected serialized data to the transmitter. A calibration circuit can be coupled between the differential output line, the multi-phase clock, and the multiplexer circuit. In these embodiments, the calibration circuit captures and digitizes the differential DC signal into a digital stream. The calibration circuit can further measure error values from the digital stream that are associated with distortion based on the calibration bit pattern. The calibration circuit can further convert the error values into respective gradient values and correct one or more phases of the multi-phase clock to compensate for the distortion based on the respective gradient values.

In various embodiments, the gradient values are first converted into a digital code, which is passed to correction circuitry, e.g., particular codes to duty cycle correction circuity (when the calibration bit pattern is for DCD) and other particular codes to skew correction circuity (when the calibration bit pattern is for skew). The correction circuitry then performs the multi-phase clock correction before the corrected multi-phase clock signal is passed to the multiplexer circuit. As the correction is performed in a loop between input and output, the calibration procedure can be continued until the error value is reduced to a particular threshold value, after which the calibration circuit can be disabled or disconnected. The network device can then be considered calibrated and thus begin operating by passing normal data through the network device. In this way, the calibration circuit is able to correct for any distortion on the multi-phase clock through a clock path that includes the transmitter and associated components, enabling reaching the tight EOJ specification required by the IEEE 802.3 Ethernet standard.

FIG. 1A is a circuit diagram of a data serializer system 100 that employs transmitter-based, multi-phase distortion correction, in accordance with at least some embodiments. In these embodiments, the system 100 includes a multi-phase clock, a first set of input lines 101, a serializer 102, a second set of input lines 104 that are fewer in number than the first set of input lines 101, a multiplexer circuit 106 coupled to the serializer 102 (e.g., via the second set of input lines), and a transmitter 108 coupled to the multiplexer circuit 106. The serializer 102 can be an M:N serializer, where M is the number of the first set of input lines 101 and N is the number of the second set of input lines, and the serializer 102 serializes input data (e.g., parallel data) from the first set of input lines 101 to the second set of input lines 104. As discussed, a calibration bit pattern can be inserted at a data input onto the first set of input lines 101 to facilitate performing the calibration. Further, N can be any number greater than two ("2"), and thus the multiplexer circuit 106 can serialize inputs at 2:1, 4:1, 8:1, and so forth.

In at least some embodiments, the system 100 includes a differential output line 110 coupled to an output of the transmitter 108, e.g., that includes a positive transmit line 110A and a negative transmit line 110B, from which the transmitter 108 transmits a differential direct-current (DC) signal. In these embodiments, the system 100 further includes a calibration circuit 150 coupled between the differential output line 110, the multi-phase clock 90, and the multiplexer circuit 106, the calibration circuit 150 being configured to detect and correct for distortion (such as PWD) in the differential DC signal during calibration of the system 100. In some embodiments, the system is a SerDes device or other network device that relies on a multi-phase clock to transmit serialized data at high transmission rates. In one embodiment, the multi-phase clock 90 is a 10+ gigahertz (GHz) clock, and the system 100 is used to transmit a 100+ giga-bits-per-second (Gbps) pulse amplitude modulation signal. Different clocks and transmission rates are envisioned in the GHz and Gbps ranges, respectively.

In various embodiments, the calibration circuit 150 includes a number of components that include, but are not limited to, a resistive-capacitive (RC) circuit 112 coupled to the differential output line 110, a calibration analog-to-digital converter (ADC) 114 coupled to the RC circuit 112, a multiply accumulator 118 coupled to the calibration ADC 114, an encoder coupled to the multiply accumulator 118, and correction circuitry 130 coupled between the multi-phase clock 90, the encoder 124, and the multiplexer circuitry 106.

In these embodiments, the RC circuit 112 captures the differential DC signal, e.g., averaging the output signal by using separate resistors (Rp, Rn) and capacitors (Cp, Cn) for each of the positive transmit line 110A and the negative transmit line 110B, respectively. By using the negative transmit line 110B as a reference to the positive transmit line 110A, and averaging the output signal, the calibration circuit 150 is able to detect the differential DC signal and avoid the need for a separate reference voltage for calibration. Sensing the DC value of the positive and negative transmit lines enables correction for non-idealities related to the clock signal in the entire signal chain through transmission. In at least some embodiments, the calibration ADC 114 converts the differential DC signal to the digital stream, e.g., via analog-to-digital conversion. In these embodiments, the calibration ADC 114 further measures error values from the digital stream that are associated with the distortion based on the calibration bit pattern, and outputs a bit stream of the error values.

In at least some embodiments, the multiply accumulator 118 converts the bit stream of error values to the gradient values and accumulates the gradient values until generating an accumulated gradient value. In these embodiments, the encoder 124 encodes the accumulated gradient value into one or more digital differential codes, which are sent to the correction circuitry 130 in order to direct the correction circuitry 130 to correct the multiple-phase clock signal from the multi-phase clock 90 before the multi-phase clock signal is sent to the multiplexer circuitry 106.

In at least some embodiments, the calibration circuit 150 further includes control logic 120 coupled to the calibration ADC 114, the multiply accumulator 118, the encoder 124, and also coupled to a pattern generator 125. The control logic 120 can be instantiated in one of a finite state machine, a programmable processor, an application-specific integrated circuit (ASIC), or the like. The control logic 120 can coordinate the initiation of the calibration components, the performance of the calibration using the calibration circuit 150, and then disable the calibration circuit 150 after calibration has been completed, as will be discussed in more detail with reference to FIGS. 2-3.

As part of this coordination, the control logic 120 can trigger (or otherwise direct) the pattern generator 125 to generate a particular calibration bit pattern to correct for at least skew, in-phase duty cycle distortion (IDCD), and quadrature duty cycle distortion (QDCD), respectively. The pattern generator 125 can supply this calibration bit pattern to the data input at the first set of input lines 101, e.g., as a separate source of input data for purposes of calibrating the data serializer system 100. Each of these possible calibration bit patterns can be time-multiplexed through the data input in order to concurrently calibrate for IDCD, QDCD, and skew within the calibration circuit 150. In some embodiments, the pattern generator 125 can be made to generate a first bit pattern (e.g., 1010) to correct for skew, a second bit pattern (e.g., 1100) to correct for IDCD, and a third bit pattern (e.g., 0110) to correct for QDCD. Because the calibration circuit 150 knows these particular calibration bit patterns at any given time are being fed as data, the calibration circuit 150 can look for skew, IDCD, or QDCD from each respective calibration bit pattern in the detected differential output signal from the transmitter 108, quantify the degree of error, and provide a differential code in order to correct for each type of distortion.

In at least some embodiments, the correction circuitry 130 includes a skew correction circuit (FIG. 6) to correct for a delay difference between an in-phase portion and a quadrature portion of the multi-phase clock and a duty cycle correction circuit (FIG. 5B) to correct for a differential in the duty cycle between the in-phase portion and an inverse in-phase portion and/or for a differential in duty cycle between a quadrature portion and an inverse quadrature portion. For example, the skew correction circuitry 130 can perform differential skew correction that corrects for a skew differential between any in-phase portion (e.g., in-phase or inverse in-phase signal) and any quadrature portion (e.g., quadrature or inverse quadrature signal). In some skew correction embodiments, the duty cycle for both the in-phase and inverse in-phase signals is shifted one direction while the duty cycle for both the quadrature and inverse quadrature signals is shifted the opposite direction to correct for the skew. Additional duty cycle and/or skew corrections can be performed iteratively until differential error values are sufficiently reduced, as will be discussed in more detail.

Figure 1B:
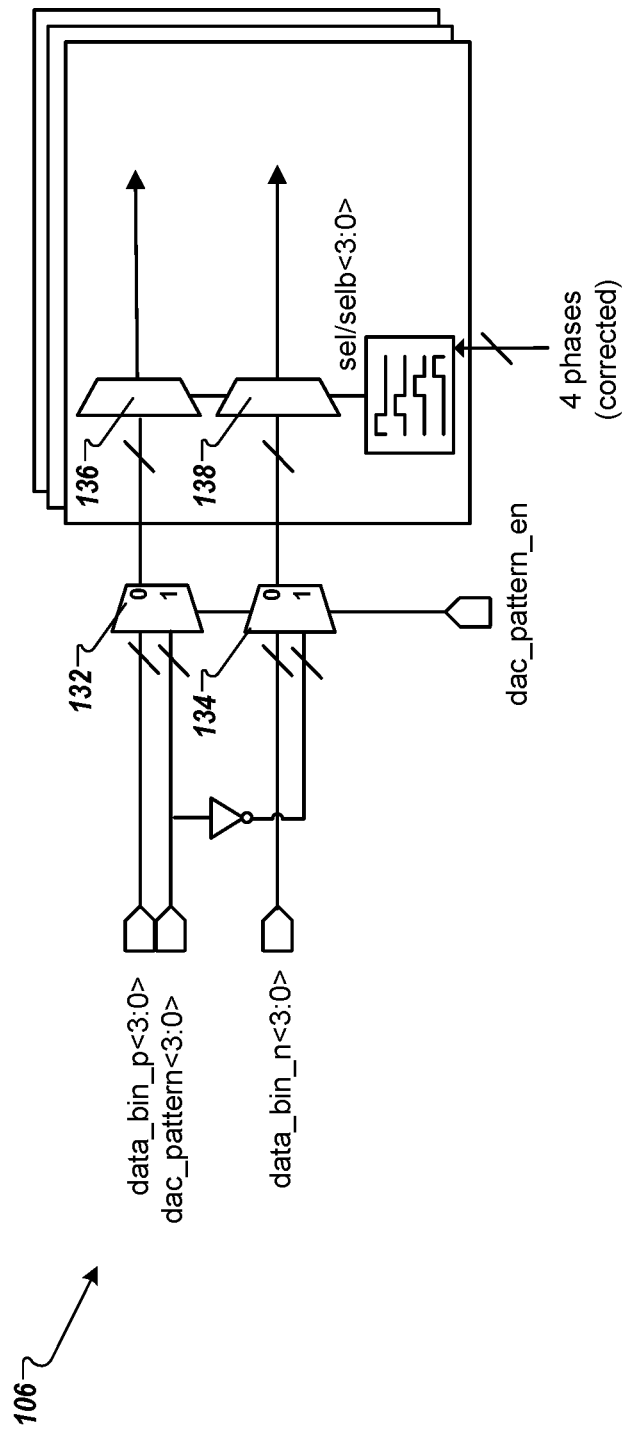
FIG. 1B is a circuit diagram of multiplexer circuitry of the data serializer system of FIG. 1A, in accordance with at least some embodiments.

FIG. 1B is a circuit diagram of multiplexer circuitry 106 of the data serializer system 100 of FIG. 1A, in accordance with at least some embodiments. In some embodiments, the multiplexer circuitry 106 also performs at least a portion of digital-to-analog conversion (DAC) of the input data streams in preparation to pass through the transmitter 108. The multiplexer circuit 106 can include a first multiplexer 132 and a second multiplexer 134. The first multiplexer 132 can receive four input lines of positive data (data_bin_p<3:0>) and a four-bit DAC data pattern (dac_pattern<3:0>) and output a first multiple bit output. The second multiplexer 134 can receive four input lines of negative data (data_bin_p<3:0>) and the four-bit DAC data pattern (dac_pattern<3:0>) and output a second multiple bit output. The first multiplexer 132 and the second multiplexer 134 can be enabled by the control logic 120, e.g., by a DAC-enabled pattern (dac_pattern_en).

In at least some embodiments, for each phase of the multi-phase clock 90, the multiplexer circuit 106 can include a third multiplexer 136 to receive the first multiple bit output and to feed the positive transmit line of the transmitter 108, and a fourth multiplexer 138 to receive the second multiple bit output and to feed the negative transmit line of the transmitter 108. The corrected multi-phase clock can be used to control the third multiplexer 136 and the fourth multiplexer 138 in order to generate the differential output signal (in analog form) that is to be scaled and transmitted by the transmitter 108 as the differential DC output signal.

Figure 1C:
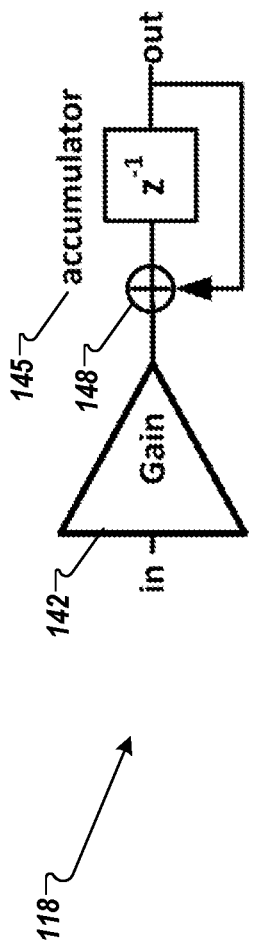
FIG. 1C is a circuit diagram of a multiply accumulator of the data serializer system of FIG. 1A, in accordance with at least some embodiments.

FIG. 1C is a circuit diagram of the multiply accumulator 118 of the data serializer system 100 of FIG. 1A, in accordance with at least some embodiments. In some embodiments, the multiply accumulator 118 is a general multiply accumulator having an digital domain multiplier 142 to provide digital gain to input error values from the calibration ADC 114 in the digital domain, and an accumulator 145 that continuously adds (e.g., using a summer 148) the output gradient value to a total gradient value ($z^{-1}$) until generating an accumulated gradient value at the output of the multiply accumulator 118. In some embodiments, the control logic 120 will cause the multiply accumulator 118 to stop accumulating gradient values when the total accumulated error value of the calibration ADC 114 satisfies a threshold number of bits of resolution. In other words, at this point, the control logic 120 has resolved the error value detected from the differential DC output signal with sufficient resolution to cause the encoder to use the accumulated gradient value of the multiply accumulator 118 to generate the digital differential codes.

Figure 2:
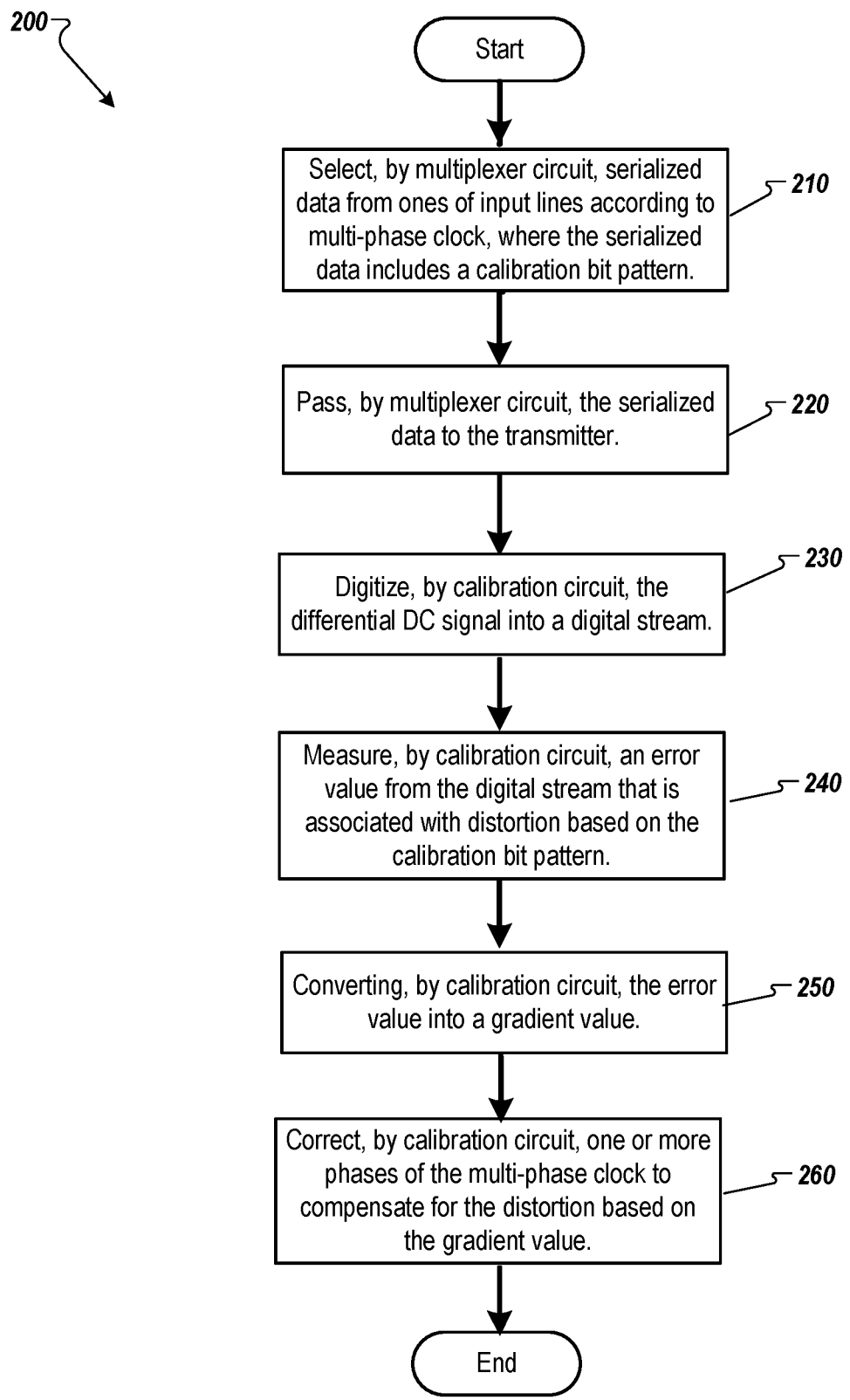
FIG. 2 is a flow diagram of a method of operating a data serializer device that corrects for distortion, in accordance with at least some embodiments.

FIG. 2 is a flow diagram of a method 200 of operating a data serializer device that corrects for distortion, such as PWD, in accordance with at least some embodiments. The method 200 can be performed by processing logic comprising hardware, software, firmware, or any combination thereof. In at least one embodiment, the method 200 is performed by the calibration circuit 150 of FIG. 1A. In at least one embodiment, the method 200 is performed by various components of the calibration circuit 150, as directed by the control logic 120. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the method 200 includes selecting, by the multiplexer circuit 106, the serialized data from ones of multiple input lines according to the multi-phase clock, wherein the serialized data includes a calibration bit pattern.

At operation 220, the method 200 includes passing, by the multiplexer circuit 106, the serialized data to the transmitter 108.

At operation 230, the method 200 includes digitizing, by the calibration circuit 150, the differential DC signal into a digital stream. In at least one embodiment, the calibration ADC 114 performs this digitization.

At operation 240, the method 200 includes measuring, by the calibration circuit 150, an error value from the digital stream that is associated with distortion based on the calibration bit pattern. In at least one embodiment, the calibration ADC 114 performs this measurement. In at least one embodiment, the distortion is pulse width distortion (PWD).

At operation 250, the method 200 includes converting, by the calibration circuit 150, the error value into a gradient value. In at least one embodiment, the multiply accumulator 118 performs this conversion.

At operation 260, the method 200 includes correcting, by the calibration circuit, one or more phases of the multi-phase clock to compensate for the distortion based on the gradient value. In at least one embodiment, the correction circuitry 130 performs this correction based on the gradient value or a differential code generated from the gradient value.

Figure 3:
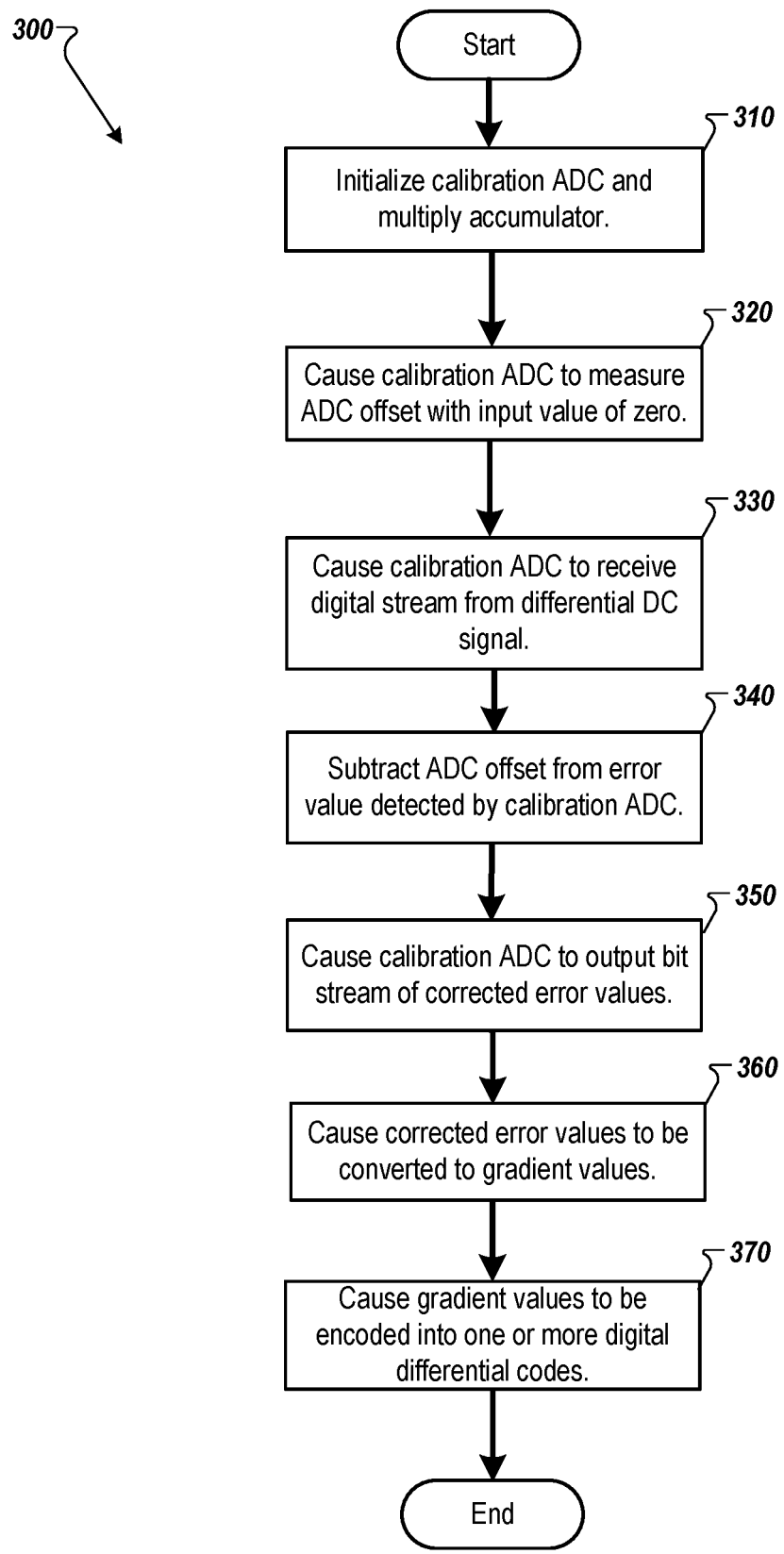
FIG. 3 is a flow diagram of a method of initialization and calibration of a data serializer device that corrects for distortion, in accordance with at least some embodiments.

FIG. 3 is a flow diagram of a method 300 of initialization and calibration of a data serializer device that corrects for distortion, such as PWD, in accordance with at least some embodiments. The method 300 can be performed by processing logic comprising hardware, software, firmware, or any combination thereof. In at least one embodiment, the method 300 is performed by the calibration circuit 150 of FIG. 1A. In at least one embodiment, the method 300 is performed by various components of the calibration circuit 150, as directed by the control logic 120, which is processing logic in some embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic initializes a calibration analog-to-digital controller (ADC), e.g., the calibration ADC 114, and the multiply accumulator 118.

At operation 320, the processing logic causes the calibration ADC to measure an ADC offset while an input to the calibration ADC 114 is forced to a zero value.

At operation 330, the processing logic causes the calibration ADC 114 to receive the digital stream generated from the differential DC signal while the calibration bit pattern is fed into the data serializer device, e.g., the data serializer system 100. As discussed, the calibration bit pattern can correct for skew, IDCD, or QDCD, and can be time-multiplexed into the data serializer device. In some embodiments, this calibration process is performed separately for each of skew, IDCD, and QDCD.

At operation 340, the processing logic subtracts the ADC offset from an error value detected by the calibration ADC 114 to generate a corrected error value associated with the PWD, e.g., whether skew, IDCD, or QDCD.

At operation 350, the processing logic causes the calibration ADC 114 to output, to the multiply accumulator 118, a bit stream of corrected error values.

At operation 360, the processing logic causes the corrected error values of the bit stream to be converted to gradient values by the multiply accumulator 118. In some embodiments, the corrected error values are iteratively accumulated into an accumulated gradient value in the multiply accumulator 118.

At operation 370, the processing logic causes the gradient values to be encoded into one or more digital differential codes useable to correct the one or more phases of the multi-phase clock. These digital differential codes will be discussed in more detail with reference to FIGS. 5A-5B and FIG. 6.

In some embodiments of the method 300, the processing logic causes the gradient values to be accumulated into an accumulated gradient value and causes the accumulated gradient value to be encoded into the one or more digital differential codes. Further, causing generation of the one or more digital differential codes can be performed in a calibration loop until the corrected error values pass below a maximum threshold value. In response to the corrected error values passing below the maximum threshold value, the processing logic can disable the calibration circuit 150, including at least disabling the calibration ADC 114.

In some embodiments, where the calibration bit pattern is to correct for skew, the method 300 further includes the processing logic causing the one or more digital differential codes to be sent to a skew correction circuit of the correction circuitry 130 such as will be discussed with reference to FIG. 6. The method 300 further includes causing, by the skew correction circuit, a set of in-phase clock signals of the multi-phase clock to be one of delayed or sped up compared to a set of quadrature clock signals of the multi-phase clock to correct for the skew.

In some embodiments, where the calibration bit pattern is to correct for duty cycle distortion (e.g., DCD), the method 300 further includes causing the one or more digital differential codes to be sent to a duty cycle correction circuit of the correction circuitry 130 such as will be discussed with reference to FIGS. 5A-5B. The method 300 further includes causing, by the duty cycle correction circuit, a duty cycle correction in a differential between the in-phase signal and the inverse in-phase signal or a differential between the quadrature signal and the inverse quadrature signal of the multi-phase clock based on the one or more digital differential codes.

Figure 4:
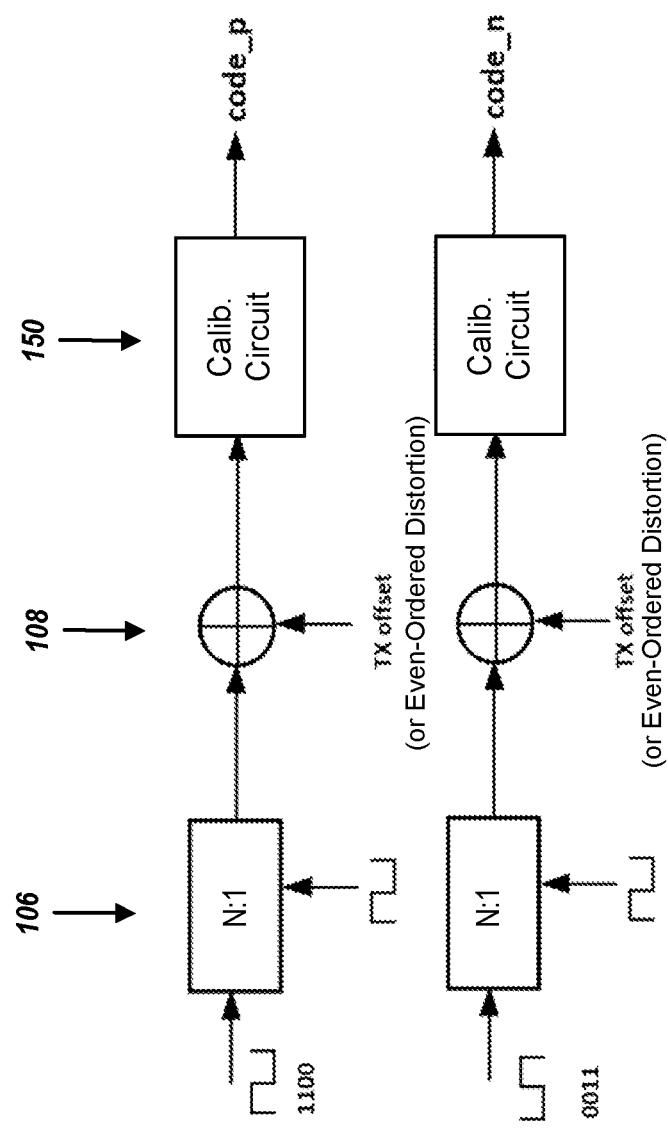
FIG. 4 is a circuit diagram illustrating an enhancement to the data serializer system of FIG. 1A to adjust for offset or even-ordered distortions in the transmitter, in accordance with at least some embodiments.

FIG. 4 is a circuit diagram illustrating an enhancement to the data serializer system 100 of FIG. 1A to adjust for offset or even-order distortions in the transmitter 108, in accordance with at least some embodiments, as the data serializer system 100 can be generally understood as insensitive to odd-order distortions. In some cases, the transmitter 108 can cause an offset or even-order distortions in the measurements, by the calibration circuit 150, of the IDCD, QDCD, and/or skew of the multi-phase clock signal. For example, because the RC circuit 112 performs averaging filtration, such offset or even-ordered distortions can remain in the differential DC signal, thus impacting the accuracy of measuring these distortions, such as PWD, for example.

To resolve this potential issue, in at least some embodiments, in response to detecting one of a signal offset or even-ordered distortions in the transmitter 108, the calibration circuit 150 averages one or more first digital differential codes (code_p), generated with the use of the calibration bit pattern, with one or more second digital differential codes (code_n), generated with the use of an inversion of the calibration bit pattern, to generate the one or more digital differential codes ultimately used by the correction circuitry 130. In some embodiments, it is the control logic 120 that performs such averaging.

With more specificity, assume only by way of example use of "1010" as the calibration bit pattern to correct for skew in the multi-phase clock signal. This calibration bit pattern could be time-multiplexed with "0101," which is the inversion of the calibration bit pattern for skew, and the generated digital differential codes also subsequently averaged. A similar approach could be taken when using "1100" to correct for IDCD, e.g., by using "0011" as the inversion of the calibration clock pattern (as illustrated in FIG. 4) or when using "0110" to correct for QDCD, e.g., by using "1001" as the inversion of the calibration clock pattern. Different calibration bit patterns are envisioned, particularly for other than a four-phase clock, and thus these are provided only by way of example.

Figure 5A:
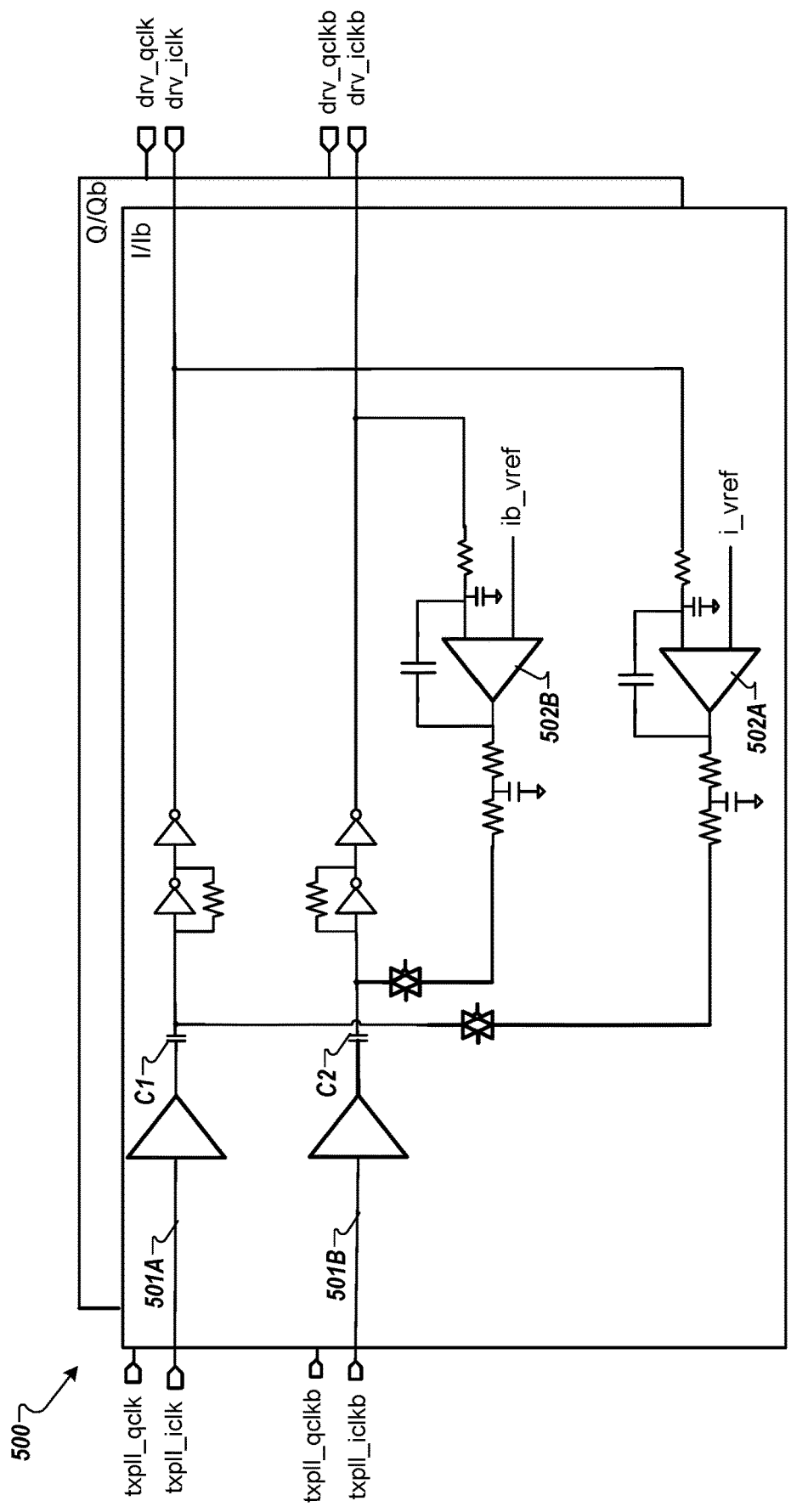
FIGS. 5A-5B are circuit diagrams of a duty cycle correction circuit, in accordance with at least some embodiments.
Figure 5B:
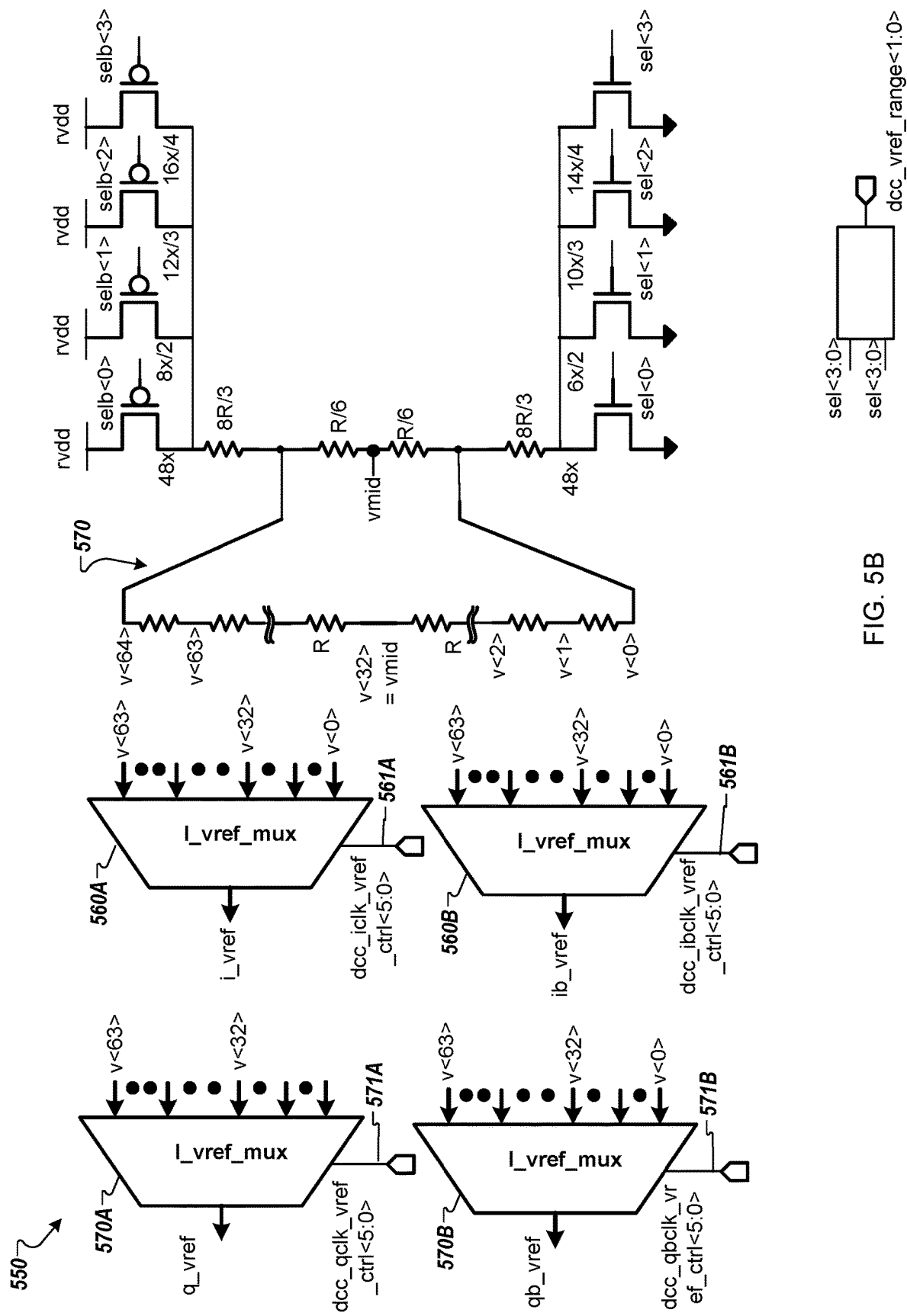

FIGS. 5A-5B are circuit diagrams of a duty cycle correction circuit, in accordance with at least some embodiments, e.g., as would be included in the correction circuitry 130 (FIG. 1A). FIG. 5A illustrates a high-level duty cycle correction circuit 500 that is partitioned with an identical set of circuitry for correcting in-phase signals (e.g., in-phase (I) and inverted in-phase (Ib)) and quadrature signals (e.g., quadrature (Q) and inverted quadrature (Qb)) of the multi-phase clock. Thus, although circuitry for the I and Ib signals is explained, the same circuitry can be employed for the Q and Qb signals. In some embodiments, each set of circuitry of the duty cycle correction circuit 500 includes various buffers along a first clock line 501A (e.g., for in-phase signals) and a second clock line 501B (e.g., for inverted in-phase signals).

In at least some embodiments, the first clock line 501A also includes a first capacitor (C1) that stores a DC voltage and thus is able to adjust the duty cycle to the in-phase signals, and the second clock line 501B also includes a second capacitor (C2) that stores a DC voltage and thus is able to adjust a duty cycle in the inverted in-phase signals. In these embodiments, the duty cycle correction circuit 500 includes a first operational amplifier 502A that is coupled to the first capacitor (C1) and configured to adjust the duty cycle of the in-phase signal according to an input reference (i_vref) of, for example, 50% duty cycle or other percentage duty cycle. The adjustment can be performed by charging or discharging the first capacitor until the duty cycle is restored. In these embodiments, the duty cycle correction circuit 500 also includes a second operational amplifier 502B that is coupled to the second capacitor (C2) and configured to adjust the duty cycle of the inverted in-phase signal according to an input reference (ib_vref) of, for example, 50% duty cycle or other percentage duty cycle.

FIG. 5B illustrates additional circuitry 550 of the duty cycle correction circuit 500 that enables additional fine-tuning DCD adjustments based on the digital differential codes generated by the encoder 124 during correction performed for IDCD or QDCD. For example, the additional circuitry 550 can include a set of a first multiplexer 560A with a first selection input 561A, a second multiplexer 560B with a second selection input 561B, a third multiplexer 570A with a third selection input 571A, and a fourth multiplexer 570B with a fourth selection input 571B. Each multiplexer receives multiple (e.g., 64) different DC voltage levels, which are generated by a multi-selectable resistance divider 570. The different DC voltage levels can be spread over an adequate range of DC voltages expected to be needed for changing the reference duty cycles used by the duty cycle correction circuit 500.

With additional specificity, in at least some embodiments, the additional circuitry 550 includes the first multiplexer 560A with a set of DC voltage level inputs that are selectable according to an in-phase code (dcc_iclk_vref_ctrl<5:0>) of the one or more digital differential codes and with an output including an in-phase reference value (i_vref) for an in-phase duty cycle control circuit. In these embodiments, the second multiplexer 560B includes the set of DC voltage level inputs that are selectable according to an inverse in-phase code (dcc_ibclk_vref_ctrl<5:0>) of the one or more digital differential codes and an output including an inverse in-phase reference value (ib_vref) for the in-phase duty cycle control circuit. In these embodiments, the third multiplexer 570A includes the set of DC voltage level inputs that are selectable according to a quadrature code (dcc_qclk_vref_ctrl<5:0>) of the one or more digital differential codes and an output including a quadrature reference value (q_vref) for a quadrature-duty-cycle control circuit. In at least some embodiments, the fourth multiplexer with the set of DC voltage level inputs that are selectable according to an inverse quadrature code (dcc_qbclk_vref_ctrl<5:0>) of the one or more digital differential codes and an output including an inverse quadrature reference value (qb_vref) for the quadrature duty cycle control circuit.

Figure 6:
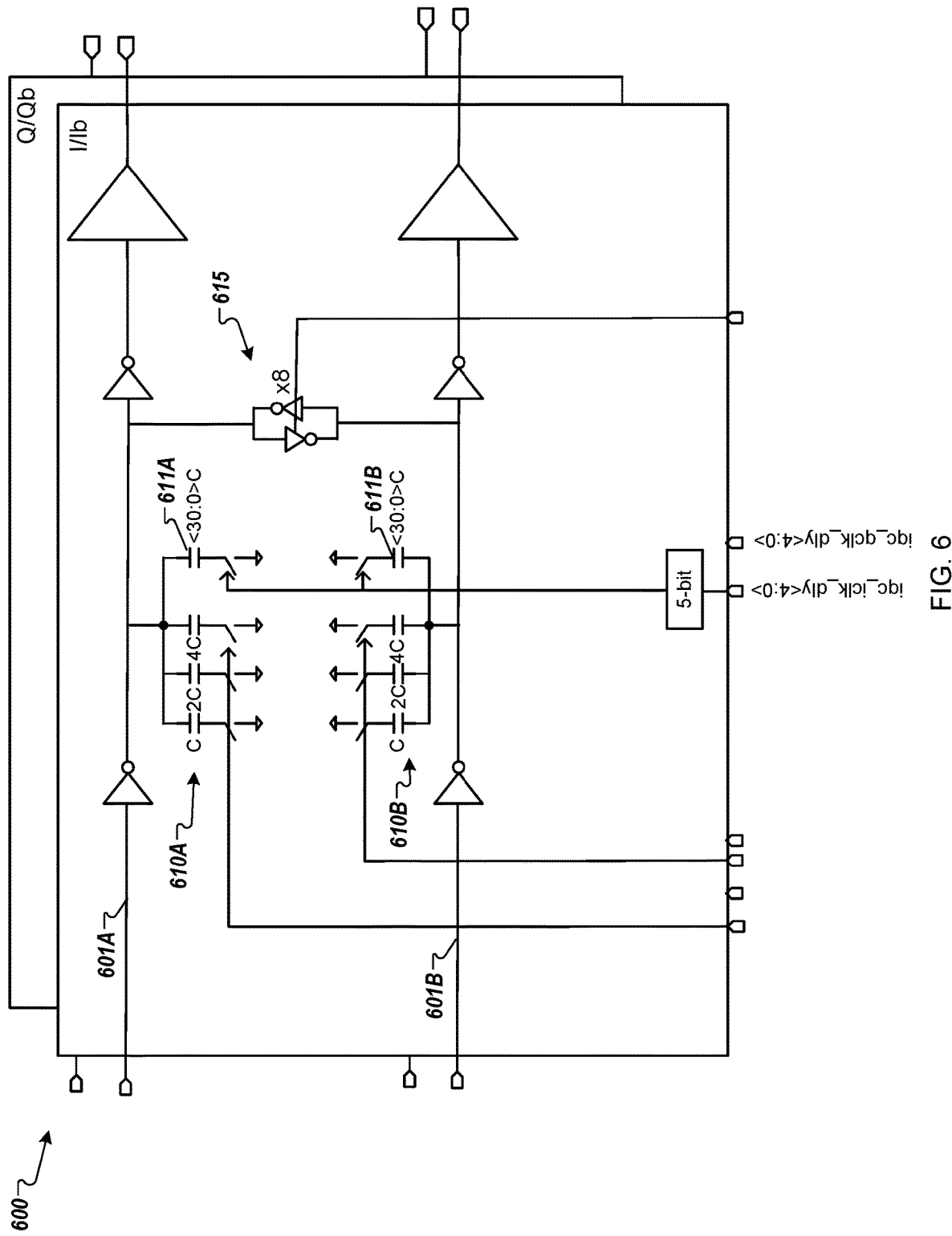
FIG. 6 is a circuit diagram of a skew correction circuit, in accordance with at least some embodiments.

FIG. 6 is a circuit diagram of a skew correction circuit 600, in accordance with at least some embodiments. The skew correction circuit 600 can be included in the correction circuitry 130 of FIG. 1A. The skew correction circuit 600 can include two identical sets of circuitry, one for correction of the in-phase (I) and inverted in-phase (Ib) signals and another for the correction of the quadrature (Q) and inverted quadrature (Qb) signals of the multi-phase clock signal. For simplicity of explanation, only the circuitry for the I/Ib signals is illustrated, but can be duplicated applicable to the Q/Qb signals.

In at least some embodiments, the I/Ib correction circuitry of the skew correction circuit 600 includes various buffers along a first clock line 601A (e.g., for in-phase signals) and a second clock line 601B (e.g., for inverted in-phase signals). In these embodiments, a first bank of capacitors 610A is connected to the first clock line 601A to provide delay to (or speed up) the I signal, and a second bank of capacitors 610B is connected to the second clock line 601B to provide delay to (or speed up) the Ib signal of the multi-phase clock. In some embodiments, individual capacitors of each bank of capacitors can be selected by the control logic 120 (e.g., via individual switches coupled to ground) in order that changes to the I and Ib signals can be jointly made with respect to the Q and Qb signals. At least some of the capacitors (e.g., labeled as C, 2C, 4C) can be provided for purposes of manual override so that the control logic 120 can individually program some specific delay offsets with respect to skew, e.g., if needed between the I and Ib signals of the multi-phase clock during operation of the system 100.

In at least some embodiments, a first segmented capacitor 611A of the first bank of capacitors 610A and a second segmented capacitor 611B of the second bank of capacitors 610B have variable capacitance and can be jointly controlled by the control logic 120 (e.g., via individual switches coupled to ground) so that change in capacitance (and thus delay of the multi-phase clock signal) can be jointly made to both the in-phase (I) and inverted in-phase (Ib) signals. With additional specificity, the skew correction circuit 600 includes the first segmented capacitor 610A connected to the first clock line 601A that is coupled to an in-phase output of the multi-phase clock. In these embodiments, the skew correction circuit 600 further includes the second segmented capacitor 611B connected to the second clock line 601B that is coupled to an inverted in-phase output of the multi-phase clock. Each of the first and second segmented capacitors is jointly variable in capacitance according to an in-phase code (iqc_iclk_dly<4:0>) of the one or more digital differential codes. This in-phase code is illustrated as a 5-bit code, but can be a different number of bits in other embodiments. In other embodiments, each of the first segmented capacitor 611A and the second segmented capacitor 611B can be replaced with a selectable chain of tri-state inverters.

Although not illustrated, for the quadrature circuitry, the skew correction circuit 600 further includes a third segmented capacitor connected to a third clock line that is coupled to a quadrature output of the multi-phase clock and a fourth segmented capacitor connected to a fourth clock line that is coupled to an inverted quadrature output of the multi-phase clock. Each of the third and fourth segmented capacitors are jointly variable in capacitance according to a quadrature code (iqc_qclk_dly<4:0>) of the one or more digital differential codes. This quadrature code is illustrated as a 5-bit code, but can be a different number of bits in other embodiments. Further, in these embodiments, a difference between the in-phase code and the quadrature code corrects for the skew. In some embodiments, the skew correction circuit 600 further includes a mutually-coupled set of inverters 615 that is connected between the first clock line 601A and the second clock line 601B.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device comprising:
  a transmitter to transmit serialized data within a differential direct-current (DC) signal over a differential output line;
  a multiplexer circuit coupled to the transmitter, the multiplexer circuit to:
    select the serialized data from ones of a plurality of input lines according to a multi-phase clock, wherein the serialized data includes a time-multiplexed series of calibration bit patterns to calibrate for distortion, the time-multiplexed series of calibration bit patterns comprising a first bit pattern to correct for skew and a second bit pattern to correct for duty cycle distortion; and
    pass the selected serialized data to the transmitter; and
  a calibration circuit coupled between the differential output line, the multi-phase clock, and the multiplexer circuit, wherein the calibration circuit is to:
    capture and digitize the differential DC signal into a digital stream;
    measure an error value from the digital stream that is associated with the distortion based on a calibration bit pattern comprising one of the first bit pattern or the second bit pattern;
    convert the error value into a gradient value; and
    correct one or more phases of the multi-phase clock to compensate for the distortion based on the gradient value.

2. The device of claim 1, further comprising a pattern generator to generate the time-multiplexed series of calibration bit patterns comprising:
  the first bit pattern to correct for skew;
  the second bit pattern to correct for in-phase duty cycle distortion (IDCD); and
  a third bit pattern to correct for quadrature duty cycle distortion (QDCD).

3. The device of claim 1, further comprising a serializer coupled to the multiplexer circuit, the serializer to receive parallel data from a first plurality of input lines and pass the parallel data to the plurality of input lines of the multiplexer circuit as the serialized data.

4. The device claim 1, wherein the calibration circuit comprises:
  a resistive-capacitive (RC) circuit coupled to the differential output line, the RC circuit to capture the differential DC signal; and
  a calibration analog-to-digital converter (ADC) coupled to the RC circuit, the calibration ADC to:
    convert the differential DC signal to the digital stream;
    measure error values from the digital stream that are associated with the distortion based on the calibration bit pattern; and
    output a bit stream of the error values.

5. The device of claim 4, wherein the calibration circuit comprises:
  a multiply accumulator coupled to the calibration ADC, the multiply accumulator to:
    convert the bit stream of the error values to respective gradient values; and
    accumulate the respective gradient values until generating an accumulated gradient value; and
  an encoder coupled to the multiply accumulator, the encoder to encode the accumulated gradient value into one or more digital differential codes.

6. The device of claim 1, wherein the calibration circuit is further to encode the gradient value into one or more digital differential codes useable to correct the one or more phases of the multi-phase clock to compensate for the distortion.

7. The device of claim 6, wherein the distortion is skew, and the calibration circuit comprises a skew correction circuit comprising:
  a first segmented capacitor connected to a first clock line, wherein the first clock line is coupled to an in-phase output of the multi-phase clock;
  a second segmented capacitor connected to a second clock line, wherein the second clock line is coupled to an inverted in-phase output of the multi-phase clock, and wherein each of the first and second segmented capacitors is jointly variable in capacitance according to an in-phase code of the one or more digital differential codes;
  a third segmented capacitor connected to a third clock line, wherein the third clock line is coupled to a quadrature output of the multi-phase clock; and
  a fourth segmented capacitor connected to a fourth clock line, wherein the fourth clock line is coupled to an inverted quadrature output of the multi-phase clock, each of the third and fourth segmented capacitors are jointly variable in capacitance according to a quadrature code of the one or more digital differential codes, and wherein a difference between the in-phase code and the quadrature code corrects for the skew.

8. The device of claim 6, wherein the distortion is one of in-phase duty cycle distortion (IDCD) or quadrature duty cycle distortion (QDCD), and the calibration circuit comprises a duty cycle correction circuit comprising:
  a first multiplexer with a set of DC voltage level inputs that are selectable according to an in-phase code of the one or more digital differential codes and with an output comprising an in-phase reference value for an in-phase duty cycle control circuit;
  a second multiplexer with the set of DC voltage level inputs that are selectable according to an inverse in-phase code of the one or more digital differential codes and with an output comprising an inverse in-phase reference value for the in-phase duty cycle control circuit;

a third multiplexer with the set of DC voltage level inputs that are selectable according to a quadrature code of the one or more digital differential codes and with an output comprising a quadrature reference value for a quadrature duty cycle control circuit; and a fourth multiplexer with the set of DC voltage level inputs that are selectable according to an inverse quadrature code of the one or more digital differential codes and with an output comprising an inverse quadrature reference value for the quadrature duty cycle control circuit.

9. The device of claim 6, wherein, in response to detecting one of a signal offset or even-order distortions in the transmitter, the calibration circuit is further to average one or more first digital differential codes, generated with use of the calibration bit pattern, with one or more second digital differential codes, generated with use of an inversion of the calibration bit pattern, to generate the one or more digital differential codes.

10. A system comprising:

a serializer to serialize data received on a first plurality of input lines to a second plurality of input lines that are fewer than the first plurality of input lines, wherein the data includes a calibration bit pattern;

a transmitter to transmit the serialized data within a differential direct-current (DC) signal over a differential output line;

a multiplexer circuit coupled between the serializer and the transmitter, the multiplexer circuit to:
  select the serialized data from ones of the second plurality of input lines according to a multi-phase clock; and
  pass the selected serialized data to the transmitter;

a calibration analog-to-digital converter (ADC) coupled to the differential output line, the calibration ADC to:
  convert the differential DC signal to a digital stream; and
  measure error values from the digital stream that are associated with distortion based on the calibration bit pattern;

a multiply accumulator coupled to the calibration ADC, the multiply accumulator to convert the error values to gradient values; and correction circuitry coupled to the multiply accumulator, the correction circuitry to correct one or more phases of the multi-phase clock to compensate for the distortion based on the gradient values.

11. The system of claim 10, wherein the distortion is pulse width distortion, further comprising a pattern generator to generate the calibration bit pattern comprising one of:
  a first bit pattern to correct for skew;
  a second bit pattern to correct for in-phase duty cycle distortion (IDCD); or
  a third bit pattern to correct for quadrature duty cycle distortion (QDCD).

12. The system of claim 10, wherein the calibration ADC is further to output a bit stream of the error values, and wherein the multiply accumulator is further to:
  convert the bit stream of the error values to the gradient values; and
  accumulate the gradient values until generating an accumulated gradient value; and
  further comprising an encoder coupled between the multiply accumulator and the correction circuitry, the encoder to encode the accumulated gradient value into one or more digital differential codes useable to correct the one or more phases of the multi-phase clock to compensate for the distortion.

13. The system of claim 12, further comprising control logic coupled to the calibration ADC and the multiply accumulator, the control logic to perform operations comprising:
  initializing the calibration ADC and the multiply accumulator;
  measuring an ADC offset within the calibration ADC while an input to the calibration ADC is forced to a zero value;
  subtracting the ADC offset from the error value before causing the calibration ADC to output the bit stream of the error values;
  causing generation of the one or more digital differential codes in a calibration loop until the error value passes below a maximum threshold value; and
  disabling the calibration ADC, the multiply accumulator, and the encoder in response to the error value passing below the maximum threshold value.

14. The system of claim 13, wherein the control logic is instantiated in one of a finite state machine, a programmable processor, or an application-specific integrated circuit (ASIC).

15. The system of claim 10, wherein correction circuitry comprises:
  a skew correction circuit to correct for a delay difference between an in-phase portion and a quadrature portion of the multi-phase clock; and
  a duty cycle correction circuit to correct for a differential in the duty cycle between the in-phase portion and an inverse in-phase portion or a differential in the duty cycle between a quadrature portion and an inverse quadrature portion.

16. A method of operating a serializer device that includes a transmitter that transmits serialized data within a differential direct-current (DC) signal over a differential output line, a multiplexer circuit coupled to the transmitter, and a calibration circuit coupled between the differential output line, a multi-phase clock, and the multiplexer circuit, wherein the method of operating the serializer device comprises:
  selecting, by the multiplexer circuit, the serialized data from ones of a plurality of input lines according to the multi-phase clock, wherein the serialized data includes a time-multiplexed series of calibration bit patterns to calibrate for distortion, the time-multiplexed series of calibration bit patterns comprising a first bit pattern to correct for skew and a second bit pattern to correct for duty cycle distortion;
  passing, by the multiplexer circuit, the serialized data to the transmitter;
  digitizing, by the calibration circuit, the differential DC signal into a digital stream;
  measuring, by the calibration circuit, an error value from the digital stream that is associated with the distortion based on a calibration bit pattern comprising one of the first bit pattern or the second bit pattern;
  converting, by the calibration circuit, the error value into a gradient value; and
  correcting, by the calibration circuit, one or more phases of the multi-phase clock to compensate for the distortion based on the gradient value.

17. The method of claim 16, wherein the serializer device further comprises control logic, and the method of operating the serializer further comprises the control logic:

initializing a calibration analog-to-digital controller (ADC) and a multiply accumulator;

causing the calibration ADC to measure an ADC offset while an input to the calibration ADC is forced to a zero value;

causing the calibration ADC to receive the digital stream generated from the differential DC signal while the calibration bit pattern is fed into the data serializer device;

subtracting the ADC offset from error values detected by the calibration ADC to generate corrected error values associated with the distortion;

causing, by the multiply accumulator, the corrected error values to be converted to gradient values; and causing the gradient values to be encoded into one or more digital differential codes useable to correct the one or more phases of the multi-phase clock.

18. The method of claim 17, wherein the calibration bit pattern is to correct for skew, the method further comprising:

causing the one or more digital differential codes to be sent to a skew correction circuit; and causing, by the skew correction circuit, a set of in-phase clock signals of the multi-phase clock to be one of delayed or sped up compared to a set of quadrature clock signals of the multi-phase clock to correct for the skew.

19. The method of claim 17, wherein the calibration bit pattern is to correct for duty cycle distortion, the method further comprising:

causing the one or more digital differential codes to be sent to a duty cycle correction circuit; and causing, by the duty cycle correction circuit, a duty cycle correction for a differential in duty cycle between an in-phase signal and an inverse in-phase signal or a differential in duty cycle between a quadrature signal and an inverse quadrature signal of the multi-phase clock based on the one or more digital differential codes.

20. The method of claim 17, further comprising the control logic:

causing the gradient values to be accumulated into an accumulated gradient value;

causing the accumulated gradient value to be encoded into the one or more digital differential codes;

causing generation of the one or more digital differential codes in a calibration loop until the corrected error values pass below a maximum threshold value; and disabling the calibration circuit, including the calibration ADC, in response to the corrected error values passing below the maximum threshold value.

* * * * *